United States Patent
Bianchi (10) Patent No.: US 9,298,205 B2
(45) Date of Patent: Mar. 29, 2016

(54) CIRCUIT FOR PROVIDING A VOLTAGE OR A CURRENT

(71) Applicant: STMicroelectronics Crolles 2 SAS, Crolles (FR)

(72) Inventor: Raul Andres Bianchi, Myans (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 231 days.

(21) Appl. No.: 14/024,876

(22) Filed: Sep. 12, 2013

(65) Prior Publication Data

US 2014/0077864 A1 Mar. 20, 2014

(30) Foreign Application Priority Data

Sep. 19, 2012 (FR) ...................... 12 58776

(51) Int. Cl.
*G05F 3/24* (2006.01)
*G01K 7/01* (2006.01)
*H01L 27/12* (2006.01)

(52) U.S. Cl.
CPC *G05F 3/245* (2013.01); *G01K 7/01* (2013.01); *H01L 27/1203* (2013.01)

(58) Field of Classification Search
CPC ............. G05F 3/22; G05F 3/225; G05F 3/24; G05F 3/242; G05F 3/245; G01K 7/01
See application file for complete search history.

(56) References Cited

U.S. PATENT DOCUMENTS

| | | | | |
|---|---|---|---|---|
| 5,103,159 | A * | 4/1992 | Breugnot et al. | 323/315 |
| 6,914,831 | B2 * | 7/2005 | Di Iorio | 365/189.09 |
| 7,592,854 | B2 * | 9/2009 | Watanabe | 327/512 |
| 8,013,588 | B2 * | 9/2011 | Imura | 323/313 |
| 8,377,804 | B2 * | 2/2013 | Momo et al. | 438/487 |
| 8,415,743 | B2 * | 4/2013 | Cai et al. | 257/348 |
| 8,735,892 | B2 * | 5/2014 | Yamazaki | 257/59 |
| 8,748,986 | B1 * | 6/2014 | Shifren et al. | 257/348 |
| 8,999,861 | B1 * | 4/2015 | Scudder et al. | 438/766 |
| 9,035,692 | B2 * | 5/2015 | Dey | G05F 3/24 327/513 |
| 9,219,078 | B2 * | 12/2015 | Cheng | H01L 21/823807 |
| 2003/0214336 | A1 * | 11/2003 | Watanabe | 327/200 |
| 2006/0197581 | A1 | 9/2006 | Chun et al. | |
| 2007/0164360 | A1 | 7/2007 | Morooka et al. | |
| 2009/0067471 | A1 | 3/2009 | Goto et al. | |
| 2009/0224327 | A1 * | 9/2009 | Liou et al. | 257/368 |
| 2011/0133822 | A1 | 6/2011 | Mazure et al. | |
| 2012/0119819 | A1 * | 5/2012 | Pyo et al. | 327/513 |
| 2013/0277747 | A1 * | 10/2013 | Liu et al. | 257/368 |

OTHER PUBLICATIONS

Hosticka, B.J. et al., "Integrated monolithic temperature sensors for acquisition and regulation," Sensors and Actuators, Elsevier, Switzerland, vol. 6, No. 3, Nov. 1984, pp. 191-200.

* cited by examiner

*Primary Examiner* — Thomas J Hiltunen
(74) *Attorney, Agent, or Firm* — Allen, Dyer, Doppelt, Milbrath & Gilchrist, P.A.

(57) ABSTRACT

An electronic circuit for providing a voltage or a current linearly dependent on temperature within a temperature range, including at least two identical MOS transistors conducting the same drain current, each transistor having a fully depleted channel which is separated from a doped semiconductor region by an insulating layer, the conductive types of the dopants of said doped semiconductor regions being different, said voltage or said current being proportional to the difference between the gate-source/drain voltages of the two transistors.

22 Claims, 4 Drawing Sheets

CIRCUIT FOR PROVIDING A VOLTAGE OR A CURRENT

CROSS REFERENCE TO RELATED APPLICATION

This application is a translation of and claims the priority benefit of French patent application Ser. No. 12/58776, filed on Sep. 19, 2012, entitled "CIRCUIT FOR PROVIDING A VOLTAGE OR A CURRENT", which is hereby incorporated by reference to the maximum extent allowable by law.

BACKGROUND

The present disclosure relates to a circuit for providing a voltage or a current having accurately-controlled temperature variations. It for example is a temperature linearly dependant (TLD) circuit for providing a voltage or a current which is linearly dependent on temperature, a circuit for providing a voltage or a current which is proportional to the absolute temperature (PTAT) circuit, or a circuit for providing a voltage or current reference, that is, a D.C. voltage or current, which is stable and accurate, substantially independent from temperature, from the circuit power supply voltage, and from circuit component manufacturing technology fluctuations.

DISCUSSION OF THE RELATED ART

There exist circuits for providing a voltage or a current having accurately-controlled temperature variations. As an example, there exist circuits for providing a bandgap voltage reference. Such circuits generally use bipolar transistors or insulated-gate field effect transistors or MOS transistors (Oxide Semiconductor Field Effect Transistor) biased in weak inversion.

There is a need for a circuit for providing a voltage or a current having accurately controlled temperature variations and formed with MOS transistors which are not necessarily biased in weak inversion.

SUMMARY

Thus, an embodiment provides an electronic circuit for providing a voltage or current linearly dependent on temperature within a temperature range, comprising at least two identical MOS transistors conducting the same drain current, each transistor having a fully depleted channel which is separated from a doped semiconductor region by an insulating layer, the conductivity types of the dopants of said doped semiconductor regions being different, said voltage or said current being proportional to the difference between the gate-source/drain voltages of the two transistors.

According to an embodiment, each transistor comprises doped semiconductor areas forming the drain and the source of the transistor, the conductivity types of the dopants of the semiconductor areas of the two MOS transistors being identical.

According to an embodiment, the doped semiconductor regions are biased to the same voltage.

According to an embodiment, the dopant concentration of the doped semiconductor regions ranges between $10^{15}$ atoms/$cm^3$ and $10^{20}$ atoms/$cm^3$.

According to an embodiment, the channel of each MOS transistor is formed in a layer of a semiconductor material separated from a substrate of the semiconductor material by the insulating layer.

According to an embodiment, the thickness of the channel of each MOS transistor is smaller than 10 nm.

According to an embodiment, the thickness of the insulating layer ranges between 10 nm and 200 nm.

Another embodiment provides a circuit for providing a voltage or a current proportional to the absolute temperature within a temperature range, comprising at least two circuits such as previously defined, wherein the dopant concentrations of at least two regions of the same conductivity type are different.

Another embodiment provides a circuit for providing a reference voltage or current independent from temperature within a temperature range, comprising at least one first electronic circuit for providing a voltage or a current linearly dependent on temperature within the temperature range such as previously defined, and a second circuit for providing a voltage or a current proportional to the absolute temperature within the temperature range such as previously defined, the variation rates of the voltages or currents provided by the first and second circuits having opposite signs.

Another embodiment provides a circuit for providing a reference voltage or current linearly dependent on temperature between two adjustable values within a temperature range, comprising at least a first electronic circuit for providing a voltage or a current linearly dependent on temperature within the temperature range such as previously defined, and a second circuit for providing a voltage or a current proportional to the absolute temperature within the temperature range such as previously defined, the variation rates of the voltages or currents provided by the first and second circuits having the same sign.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

For certain applications, it is desirable to have a circuit for providing a voltage or a current having accurately-controlled temperature variations. It for example is a TLD circuit, a PTAT circuit, or a circuit for providing a voltage or current reference. An example of a voltage reference circuit is a bandgap reference circuit which provides a voltage reference having a value close to the bandgap of silicon at 0 K. A PTAT circuit may be formed with two TLD circuits. A voltage reference circuit may be formed with a PTAT circuit and a TLD circuit. The PTAT circuit provides a first current which is proportional to temperature. The TLD circuit provides a second current which de-creases according to temperature. The addition of these currents and the adjustment of their slopes creates a stable reference.

Bipolar transistors may be used to form the TLD and PTAT circuits. However, the electronic circuit power supply voltage should be high enough to properly bias the bipolar transistors. The power supply voltage of such circuits must thus generally be greater than 1.5 V. This may raise a problem of compatibility with the current tendency to decrease the integrated circuit power supply voltage.

Further, the integration of bipolar transistors to an integrated circuit, further comprising MOS transistors, causes additional constraints on design of the integrated circuit. There exist TLD and PTAT circuits which only use MOS transistors. However, such transistors have to be biased in weak inversion. They generally have large dimensions.

An electronic circuit for providing a voltage or a current having accurately-controlled temperature variations and which is formed based on MOS transistors which are not necessarily biased in weak inversion is thus needed.

Advantageously, the power supply voltage of a circuit according to an embodiment can be decreased with respect to the power supply voltage of an equivalent circuit comprising bipolar transistors. Thereby, the integration of the electronic circuit according to an embodiment in an integrated circuit with MOS transistors is eased since the design parameters of the MOS transistors used to form the electronic circuit according to an embodiment may be the same as for the other MOS transistors of the integrated circuit. In particular, the power supply voltage provided for the integrated circuit MOS transistors can also be used with the MOS transistors of the electronic circuit according to an embodiment.

Further, the size of the electronic circuit according to an embodiment can be decreased with respect to an equivalent circuit comprising bipolar transistors or MOS transistors biased in weak inversion.

An embodiment uses at least two MOS transistors. Each MOS transistor comprises a fully depleted channel on a region of a doped semiconductor material and separated from it by a layer of an insulating material. The dopant concentration of the region adjacent to the channel is different for the two MOS transistors so that the threshold voltages of these transistors are different.

As an example, the MOS transistors are formed with a silicon-on-insulator or SOI-type support. An SOI support comprises a layer of a semiconductor material separated from a substrate of a semiconductor material by an insulating layer. The drain, source, and channel regions of the MOS transistors are formed in the semiconductor material layer.

More specifically, the MOS transistors may be formed according to an FDSOI (Fully Depleted Silicon On Insulator) manufacturing method, according to which the semiconductor material layer is sufficiently thin, generally of a thickness smaller than 10 nm, for the channel of each MOS transistor to be fully depleted in operation.

Advantageously, the operating principle of the circuit for providing a voltage or a current according to an embodiment is independent from the design parameters of said MOS transistors with a fully depleted channel, especially the channel length, the channel width, and the bias currents and voltage. Thereby, these parameters may be conventionally determined during phases of design of the integrated circuit comprising the circuit for providing a voltage or a current according to an embodiment. Further, the MOS transistors may operate in strong inversion.

Figure 1:
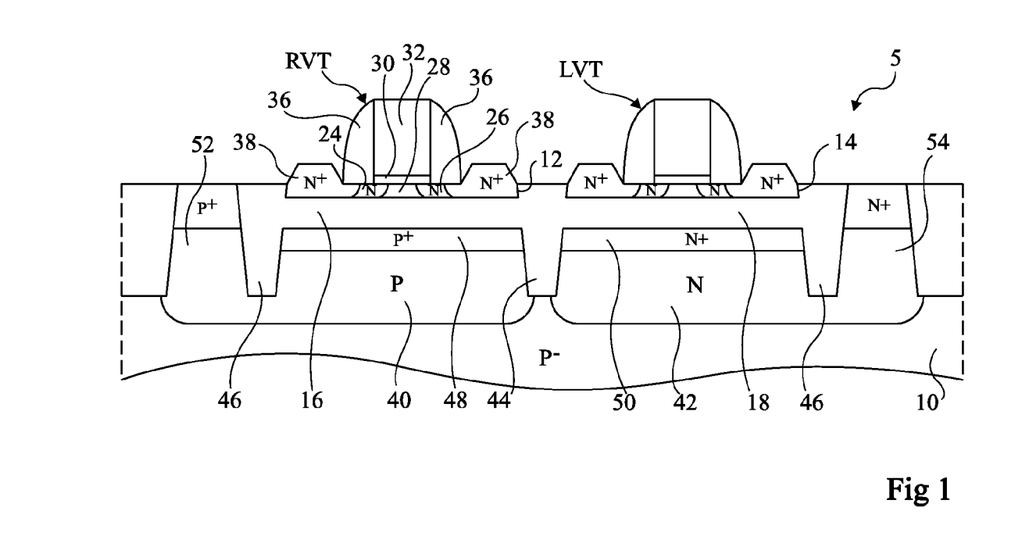
FIG. 1 is a partial simplified cross-section view of an embodiment of an integrated circuit suitable for the forming of an electronic circuit for providing a voltage having accurately controlled temperature variations.

FIG. 1 shows an embodiment of an integrated circuit 5 comprising a substrate 10 of a semiconductor material, for example, undoped silicon or lightly-doped silicon of a first conductivity type, for example, type P, with a dopant concentration for example on the order of $10^{15}$ atoms/cm$^3$. Circuit 5 further comprises two regions 12, 14 of the semiconductor material having a thickness smaller than 10 nm, for example, on the order of 7 nm. Region 12 is separated from substrate 10 by an insulating layer 16 and region 14 is separated from substrate 10 by an insulating layer 18. Insulating layers 16, 18 have a thickness ranging between 10 nm and 200 nm, for example, on the order of 25 nm.

Circuit 5 comprises two MOS transistors RVT and LVT. These are MOS transistors having source and drain regions doped with the same dopant type. As an example, each transistor RVT, LVT comprises lightly-doped N-type drain and source regions 24, an undoped channel region 28 between drain 24 and source 26, an insulating layer 30 covering channel region 28, a portion 32 of a conductive material covering insulating layer 30 and forming the transistor gate, insulating portions 36 on either side of gate 32, and N-type regions 38 more heavily doped than drain and source regions 24, 26, which are an extension of drain and source regions 24 and 26. The drain, the source, and the channel of transistor RVT are formed in region 12 and the drain, the source, and the channel of transistor LVT are formed in region 14. As an example, gate insulator 30 is made of a material of high permittivity.

Transistors RVT and LVT are identical. This means that they have substantially the same dimensions (especially the same channel width and length) and that the dopant concentrations of the source and drain regions are substantially the same.

A P-type region 40 more heavily doped than substrate 10 and an N-type doped region 42 are formed in substrate 10. Region 40 extends under transistor RVT and region 42 extends under transistor LVT. Regions 40, 42 are laterally delimited by insulating regions 44, 46. A P-type region 48 more heavily doped than region 40 is provided between insulating layer 16 and P-type region 40 and an N-type region 50 more heavily doped than region 42 is provided between insulating layer 18 and N-type region 42. Regions 40 and 48 may be biased by a P-type well 52 which connects P-type region 40 to the surface of circuit 5 and regions 42 and 50 may be biased by an N-type well 54 which connects N-type region 42 to the surface of circuit 5. As a variation, P-type regions 40 and 48 may be confounded and N-type regions 42 and 50 may be confounded.

Call Na the concentration of P-type dopants of region 48 and Nd the concentration of N-type dopants of region 50. Concentrations Na and Nd are smaller than or equal to $10^{20}$ atoms/cm$^3$, and preferably vary from $10^{15}$ atoms/cm$^3$ to $10^{20}$ atoms/cm$^3$, and are for example equal to approximately $10^{18}$ atoms/cm$^3$.

The thickness of regions 12 and 14 is sufficiently low for the channels of MOS transistors RVT and LVT to be advantageously fully depleted in operation. Further, the thickness of insulating layers 16, 18 is sufficiently low for regions 48, 50 to be able to advantageously influence the threshold voltages of transistors RVT and LVT.

The inventor has shown that difference $\Delta V_{RVT-LVT}$ between threshold voltage $VT_{RVT}$ of transistor RVT and threshold voltage $VT_{LVT}$ of transistor LVT may be expressed according to the following relation (1):

$$\Delta VT_{RTV-LVT} = \tag{1}$$
$$VT_{RVT} - VT_{LVT} = \left[Vbg(T) - \frac{k \cdot T}{q}\ln\left(\frac{Kp \cdot Kn \cdot T^3}{Na \cdot Nd}\right)\right] \cdot K_{Body\text{-}Bias}$$

where:
k is Boltzmann's constant;
T is the absolute temperature (in Kelvin);
q is the electric charge of the electron;
Kp is a parameter associated with the density of states in the valence band of the P-type doped material of region 48;
Kn is a parameter associated with the density of states in the conduction band of the N-type doped material of region 50;
Vbg(T) is the bandgap voltage of the semiconductor material and depends on temperature; and
$K_{Body\text{-}Bias}$ is a coefficient independent from temperature.

Coefficient $K_{Body\text{-}Bias}$ is provided by the following relation (2):
where:

$$K_{Body\text{-}Bias} = \frac{CETgate}{CETgate + Tbox + Tsi/3} \tag{2}$$

CETgate is the equivalent silicon oxide thickness of gate insulator 30 of MOS transistor RVT, LVT;
Tbox is the thickness of insulating layer 16, 18; and
Tsi is the thickness of silicon region 12, 14.

Bandgap voltage Vbg(T) is provided by the following empirical relation (3):

$$Vbg(T) = Vbg0 - \frac{a \cdot T^2}{T + b} \tag{3}$$

where Vbg0, a, and b are constants which depend on the semiconductor material.

Threshold voltage difference $\Delta V_{RVT-LVT}$ is due to the doping difference between regions 48 and 50 and not to a doping difference between the transistors channels. The conduction of the channels of transistors RVT and LVT is thus advantageously identical, given that it is not affected by the doping difference between regions 48 and 50.

Based on relations (1) and (3), the following relation (4) is obtained:

$$\Delta VT_{RTV-LVT} = VGP \cdot K_{Body\text{-}Bias} \tag{4}$$
$$= \left[Vbg(0) - \frac{a \cdot T^2}{T+b} - \frac{k \cdot T}{q}\ln\left(\frac{Kp \cdot Kn \cdot T^3}{Na \cdot Nd}\right)\right] \cdot K_{Body\text{-}Bias}$$

Considering a temperature T0, an approximation of relation (4) in the vicinity of temperature T0 may be obtained by performing a linear development of first order of relation (4) around temperature T0. The following relation (5) according to which threshold voltage difference $\Delta V_{RVT-LVT}$ is linearly temperature-dependent is obtained:

$$\Delta VT_{RTV-LVT} = (VGP_0 - VGP_{slope} \cdot T) \cdot K_{Body\text{-}Bias} \tag{5}$$

$$VGP_0 = Vbg0 + \frac{a \cdot T0^2}{T0+b} - \frac{a \cdot T0^3}{(T0+b)^2} + 3\frac{k \cdot T0}{q}$$

$$VGP_{slope} = a\left(\frac{2 \cdot T0}{T0+b} - \frac{T0^2}{(T0+b)^2}\right) + \frac{k}{q}\left(\ln\left(\frac{Kp \cdot Kn \cdot T0^3}{Na \cdot Nd}\right) + 3\right)$$

The curve of variation of threshold voltage difference $\Delta V_{RVT-LVT}$ thus corresponds to a straight line having an origin equal to $K_{Body\text{-}Bias} \cdot VGP_0$ and a slope equal to $K_{Body\text{-}Bias} \cdot VGP_{slope}$.

Figure 2:
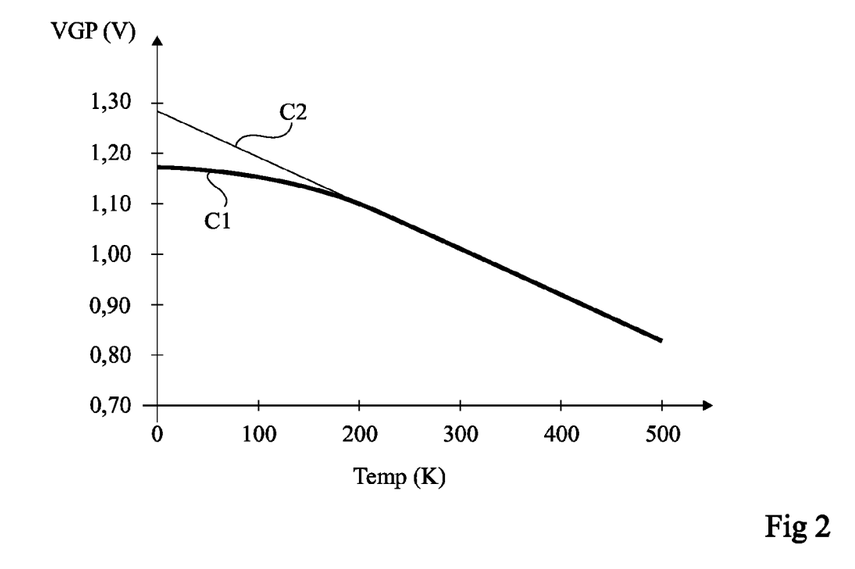
FIG. 2 shows voltage-versus-temperature curves, illustrating the principle used here.

FIG. 2 shows, according to temperature, curve C1 of variation of voltage VGP according to relation (4) and curve C2 of variation of voltage VGP according to relation (5) when Vbg (0) is equal to 1.17 V, a is equal to $4.73 \cdot 10^{-4}$ V/K, b is equal to 636 K, T0 is equal to 322 K, k/q is equal to $8.6174 \cdot 10^{-5}$ J/KC and KnKp/(NaNd) is equal to $2.6963 \cdot 10^{-6}$ 1/K$^3$. Relation (5) then becomes the following relation (6):

$$\Delta VT_{RVT-LVT} = (1{,}285 - 0{,}0009105 \cdot T) \cdot K_{Body\text{-}Bias} \tag{6}$$

The inventor has shown that for temperatures varying from approximately −50° C. (approximately 223 K) to approximately 150° C. (approximately 423 K), the difference between the values of voltage VGP obtained by relation (4) and by relation (5) is smaller than 0.2%.

When dopant concentrations Na and Nd are strictly greater than $10^{20}$ atoms/cm$^3$, relation (1) is no longer valid. More specifically, the natural logarithm term is no longer present in relation (1). It is then no longer possible to vary term $VG_{slope}$ by modifying dopant concentrations Na and Nd.

As can be observed from relations (5), the terms which appear in the expression of threshold voltage difference $\Delta V_{RVT-LVT}$ are imposed by physical phenomena (Vgb0, a, b, k, q, T0, Kp, Kn) or correspond to technological parameters (CETgate, Tbox, Tsi, Na, Nd). Threshold voltage difference $\Delta V_{RVT-LVT}$ thus does not depend on the design parameters of MOS transistors RVT and LVT.

Figure 3:
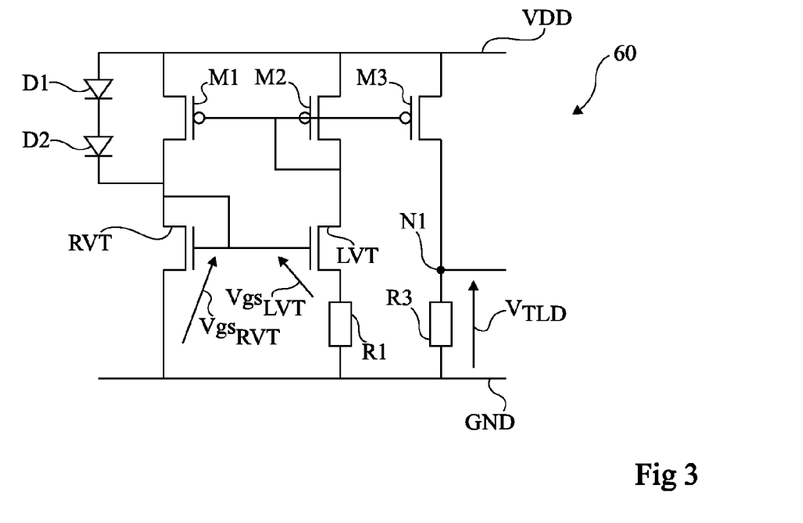
FIG. 3 shows an embodiment of a TLD circuit.

FIG. 3 shows an embodiment of a TLD electronic circuit 60 for providing a linearly temperature-dependent voltage.

Circuit 60 comprises previously-described MOS transistors RVT and LVT. Regions 48 and 50 are biased to a source of a reference voltage, for example, ground GND. The source of transistor RVT is connected to ground GND. The drain of transistor RVT is connected to the gate of transistor RVT and to the gate of transistor LVT. The source of transistor LVT is connected to a terminal of a resistor R1 having its other terminal connected to ground GND.

Circuit 60 further comprises a current mirror comprising P-channel MOS transistors M1, M2, and M3. The source of transistor M1 is connected to a source of a high reference voltage VDD. The drain of transistor M1 is connected to the drain of transistor RVT. The gate of transistor M1 is connected to the gate of transistor M2 and to the gate of transistor M3. The source of transistor M2 is connected to the source of high reference voltage VDD. The drain of transistor M2 is connected to the drain of transistor LVT and to the gate of transistor M2. The source of transistor M3 is connected to the source of high reference voltage VDD. The drain of transistor M3 is connected to a node N1. The voltage between node N1 and ground GND is called $V_{TLD}$. The voltage between the gate and the source of transistor RVT is called $Vgs_{RVT}$ and the voltage between the gate of the source of transistor LVT is called $Vgs_{LVT}$.

MOS transistors M1, M2, and M3 are not necessarily transistors having a fully-depleted channel. MOS transistors M1, M2, and M3 are identical. This means that they have substantially exactly the same dimensions and that the dopant concentrations of the source and drain regions are substantially the same.

Circuit 60 may further comprise two diodes D1 and D2 in series between the source of high voltage VDD and the drain of transistor RVT, the anode of diode D1 being connected to the source of high voltage VDD and the cathode of diode D2 being connected to the drain of transistor RVT. Diodes D1 and D2 are used to properly bias the transistors on starting of circuit 60 and may be omitted.

Circuit 60 powers a resistor R3 assembled between node N1 and ground GND.

The current flowing through resistor R1 also flows through resistor R3. Voltage $V_{TLD}$ is thus obtained by the following relation (7):

$$V_{TLD} = (Vgs_{RVT} - Vgs_{LVT}) \cdot \frac{R3}{R1} \quad (7)$$

Voltage $Vgs_{RVT}$ is obtained by the following relation (8):

$$Vgs_{RVT} = VT_{RVT} + \sqrt{\frac{Id_{RVT}}{\mu_0 Cox_{RVT} \frac{W_{RVT}}{L_{RVT}}}} \quad (8)$$

where $Id_{RVT}$ is the drain current of transistor RVT, $\mu_0$ is the permittivity of vacuum, $Cox_{RVT}$ is the capacitance of insulating layer 30 of the gate of transistor RVT, $W_{RVT}$ is the channel width of transistor RVT, and $L_{RVT}$ is the channel length of transistor RVT.

Similarly, voltage $Vgs_{LVT}$ is obtained by the following relation (9):

$$Vgs_{LVT} = VT_{LVT} + \sqrt{\frac{Id_{RVT}}{\mu_0 Cox_{RVT} \frac{W_{RVT}}{L_{RVT}}}} \quad (9)$$

where $Id_{LVT}$ is the drain current of transistor LVT, $Cox_{LVT}$ is the capacitance of the insulating layer of the gate of transistor LVT, $W_{LVT}$ is the channel width of transistor LVT, and $L_{LVT}$ is the channel length of transistor LVT.

Since transistors RVT and LVT are identical, width $W_{RVT}$ is equal to width $W_{LVT}$, length $L_{RVT}$ is equal to length $L_{LVT}$, and capacitance $Cox_{RVT}$ is equal to capacitance $Cox_{LVT}$. Further, currents $Id_{RVT}$ and $Id_{LVT}$ are equal. Relation (7) can be simplified as follows:

$$V_{TLD} = \Delta VT_{RVT\text{-}LVT} \cdot \frac{R3}{R1} \quad (10)$$

Based on relation (5), it can be deduced that, in the range from −50° C. to 150° C., voltage $V_{TLD}$ is linearly temperature dependent.

Since the operating voltages of MOS transistors are smaller than the operating voltages of bipolar transistors, power supply voltage VDD of circuit 60 may be smaller than that which would be necessary to power a TLD circuit similar to circuit 60 and comprising bipolar transistors. As an example, power supply voltage VDD may be lower than 1 V.

Figure 4:
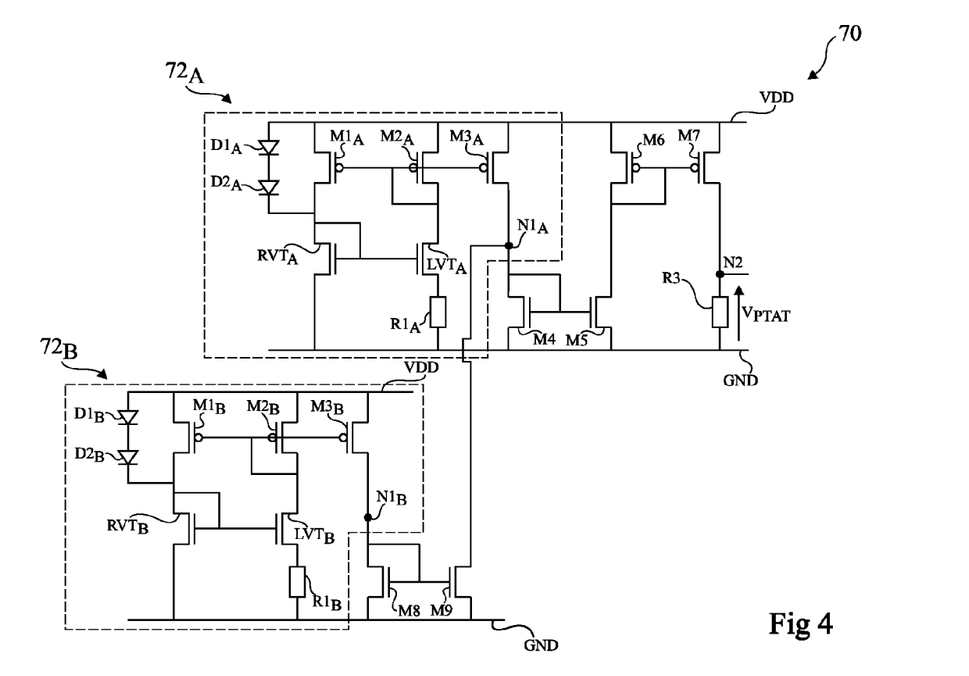
FIG. 4 shows an embodiment of a PTAT circuit.

FIG. 4 shows an embodiment of a PTAT circuit 70. Circuit 70 comprises two TLD circuits $72_A$ and $72_B$ corresponding to TLD circuit 60 shown in FIG. 3. The elements common with circuit 60 of FIG. 3 are designated with the same reference numeral followed by index A for circuit $72_A$ and by index B for circuit $72_B$. Transistors $M1_A$, $M2_A$, and $M3_A$ are identical. Transistors $M1_B$, $M2_B$, and $M3_B$ are identical. Resistors $R1_A$ and $R1_B$ are identical and will be designated as R2 hereinafter.

Circuit 70 comprises a current mirror comprising N-channel MOS transistors M4 and M5. The source of transistor M4 is connected to ground GND. The drain of transistor M4 is connected to node $N1_A$, to the gate of transistor M4, and to the gate of transistor M5. The source of transistor M5 is connected to ground GND.

Circuit 70 comprises a current mirror comprising P-channel MOS transistors M6 and M7. The source of transistor M6 is connected to the source of high voltage VDD. The drain of transistor M6 is connected to the drain of transistor M5, to the gate of transistor M6, and to the gate of transistor M7. The source of transistor M7 is connected to the source of high voltage VDD. The drain of transistor M7 is connected to a node N2. The voltage between node N2 and the ground is called $V_{PTAT}$. Circuit 70 powers a resistor R3 between node N2 and the ground.

Circuit 70 comprises a current mirror comprising N-channel MOS transistors M8 and M9. The source of transistor M8 is connected to ground GND. The drain of transistor M8 is connected to node $N1_B$, to the gate of transistor M8, and to the gate of transistor M9. The source of transistor M9 is connected to ground GND. The drain of transistor M9 is connected to node $N1_A$.

MOS transistors M4, M5, M6, M7, M8, and M9 are not necessarily transistors having a fully-depleted channel.

Transistor M4 is identical to transistor M5. Transistor M6 is identical to transistor M7. Transistor M8 is identical to transistor M9.

Call $Na_A$ the dopant concentration of region 48 associated with transistor $RVT_A$, $Na_B$ the dopant concentration of region 48 associated with transistor $RVT_B$, $Nd_A$ the dopant concentration in region 50 associated with transistor $LVT_A$, and $Nd_B$ the dopant concentration of region 50 associated with transistor $LVT_B$. Considering that thicknesses CETgate, Tbox, and Tsi are the same for transistors $RVT_A$, $LVT_A$, $RVT_B$, and $LVT_B$, the following relation (11) is obtained:

$$\Delta VT_{RVT_A - LVT_A} - \Delta VT_{RVT_B - LVT_B} = \frac{k}{q} \ln\left(\frac{Na_A \cdot Nd_A}{Na_B \cdot Nd_B}\right) \cdot K_{Body\text{-}Bias} \cdot T \quad (11)$$

As an example, concentrations $Na_A$ and $Na_B$ may be equal and concentrations $Nd_A$ and $Nd_B$ may be different. As an example, dopant concentration $Nd_B$ is strictly lower than dopant concentration $Nd_A$. Regions 48, 50 of transistors $RVT_A$, $LVT_A$, $RVT_B$, and $LVT_B$ are all biased by the same reference voltage source, for example, ground GND.

Voltage $V_{PTAT}$ is provided by the following relation (12):

$$V_{PTAT} = (\Delta VT_{RVT_A - LVT_A} - \Delta VT_{RVT_B - LVT_B}) \cdot \frac{R3}{R2} \quad (12)$$

$$= \frac{k}{q} \ln\left(\frac{Na_A \cdot Nd_A}{Na_B \cdot Nd_B}\right) \cdot K_{Body\text{-}Bias} \cdot \frac{R3}{R2} \cdot T$$

Voltage $V_{PTAT}$ is thus effectively proportional to the absolute temperature.

Figure 5:
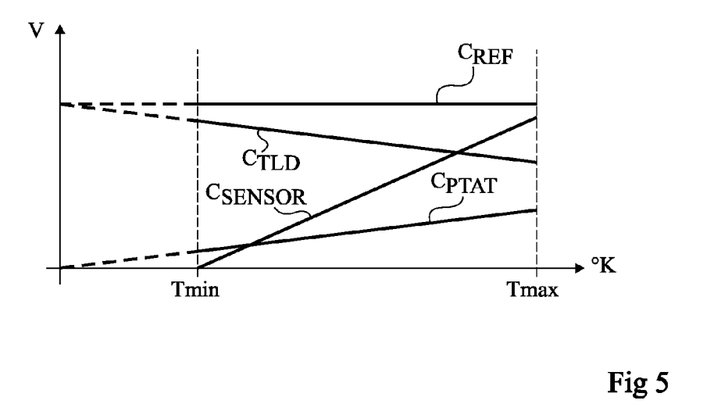
FIG. 5 shows voltage-versus-temperature curves, illustrating the operating principle of a circuit for providing a reference voltage.

FIG. 5 illustrates the forming principle of a circuit for providing a voltage reference or of a circuit for providing a linearly temperature-dependent voltage, for which the values of the voltage for two temperatures $T_{MIN}$ and $T_{MAX}$ may be arbitrarily selected.

Such circuits use a PTAT circuit and a TLD circuit of negative slope. Curve $C_{TLD}$ is the curve of variation according to temperature of the voltage provided by the TLD circuit and curve $C_{PTAT}$ is the curve of variation according to temperature of the voltage provided by the PTAT circuit. Curve $C_{REF}$ is the curve of variation according to temperature of a voltage reference obtained by the sum of the voltages provided by the PTAT and TLD circuits (curve $C_{REF}$). Curve $C_{SENSOR}$ is the curve of variation of a linearly temperature-dependent voltage, for which the voltage values for two temperatures $T_{MIN}$ and $T_{MAX}$ are arbitrarily selected, and which is obtained by the difference between the voltages provided by the PTAT and TLD circuits.

By adding voltage $V_{TLD}$ according to relation (10) and voltage $V_{PTAT}$ according to relation (12), a voltage $V_{REF}$ independent from temperature is obtained according to the following relation (14)

$$V_{REF} = V_{PTAT} + V_{TLD} = \qquad (14)$$
$$\frac{R3}{R1}\left(Vgb0 + \frac{a \cdot T0^2}{T0+b} - \frac{a \cdot T0^3}{(T0+b)^2} + 3\frac{k \cdot T0}{q}\right) \cdot K_{Body\text{-}Bias}$$

if the following relation (15) is verified:

$$\frac{R2}{R1} = \frac{\frac{k}{q} \cdot \ln\left(\frac{Na_A \cdot Nd_A}{Na_B \cdot Nd_B}\right)}{a \cdot \left(\frac{2 \cdot T0}{T0+b} - \frac{T0^2}{(T0+b)^2}\right) + \frac{k}{q}\left(\ln\left(\frac{Kp \cdot Kn \cdot T0^3}{Na \cdot Nd}\right) + 3\right)} \qquad (15)$$

As an example, for the numerical values previously described for relation (6), relations (14) and (15) become:

$$V_{REF} = 1.285 \cdot \frac{R3}{R1} \cdot K_{body\text{-}Bias} \qquad (16)$$

$$\text{if } \frac{R2}{R1} = \frac{\frac{k}{q} \cdot \ln\left(\frac{Na_A \cdot Nd_A}{Na_B \cdot Nd_B}\right)}{0.0009105}$$

The inventor has shown that the difference between voltage $V_{REF}$ obtained by relation (16) and voltage $V_{REF}$ really obtained is smaller than 0.25% for the temperature range from −50° C. to 150° C.

To form a temperature sensor, the voltage provision circuit must provide a linearly temperature-dependent voltage, for which the voltage values for temperatures $T_{MIN}$ and $T_{MAX}$ are arbitrarily selected. As an example, the voltage for temperature $T_{MIN}$ may be zero and the voltage of temperature $T_{MAX}$ may be equal to $V_{SENSOR\_MAX}$.

By subtracting voltage $V_{TLD}$ according to relation (10) to voltage $V_{PTAT}$ according to relation (12), a voltage $V_{SENSOR}$ is obtained according to the following relation (17):

$$V_{SENSOR} = V_{PTAT} - V_{TLD} = V_{SENSOR\_MAX} \cdot \frac{T - T_{MIN}}{T_{MAX} - T_{MIN}} \qquad (17)$$

if the following relation (18) is verified:

$$\frac{R2}{R1} = \frac{\frac{k \cdot T_{MIN}}{q} \cdot \ln\left(\frac{Na_A \cdot Nd_A}{Na_B \cdot Nd_B}\right)}{VGP_0 - VGP_{slope} \cdot T_{MIN}} \qquad (18)$$

As an example, for the numerical values previously described for relation (6), relations (17) and (18) become:

$$V_{SENSOR\_MAX} = 1.285 \cdot \frac{R3}{R1} \cdot \left(\frac{T_{MAX}}{T_{MIN}} - 1\right) \cdot K_{Body\text{-}Bias} \qquad (19)$$

$$\frac{R2}{R1} = \frac{\frac{k \cdot T_{MIN}}{q} \cdot \ln\left(\frac{Na_A \cdot Nd_A}{Na_B \cdot Nd_B}\right)}{1.285 - 0.0009105 \cdot T_{MIN}}$$

The inventor has shown that the temperature variations obtained from relation (18) with respect to the temperature really measured are smaller than 0.6° C. for the temperature range from −50° C. to 150° C.

Figure 6:
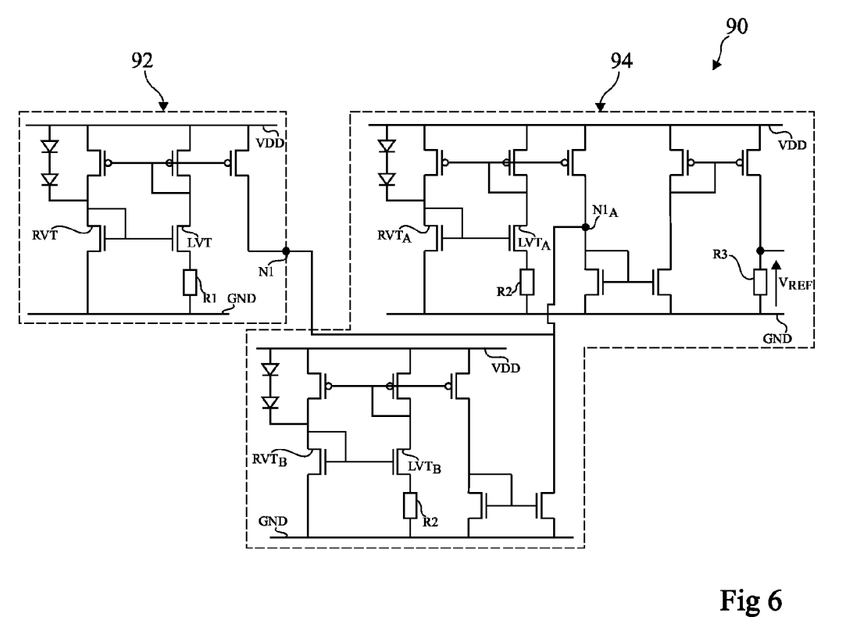
FIG. 6 shows an embodiment of a circuit for providing a voltage reference.

FIG. 6 shows an embodiment of a circuit 90 for providing a voltage reference. Circuit 90 comprises an LTD circuit 92 identical to circuit 60 shown in FIG. 3 and a PTAT circuit 94 identical to circuit 70 shown in FIG. 4. Node N1 of LTD circuit 92 is connected to node $N1_A$ of PTAT circuit 94.

The current flowing through resistor R3 is equal to the sum of the current provided by LTD circuit 92 and of the current provided by PTAT circuit 94. This corresponds to previously-described relation (14) if resistors R1 and R2 verify relation (15). Resistor R3 and factor $K_{Body\text{-}Bias}$ enable to modify the level of voltage $V_{REF}$.

Figure 7:
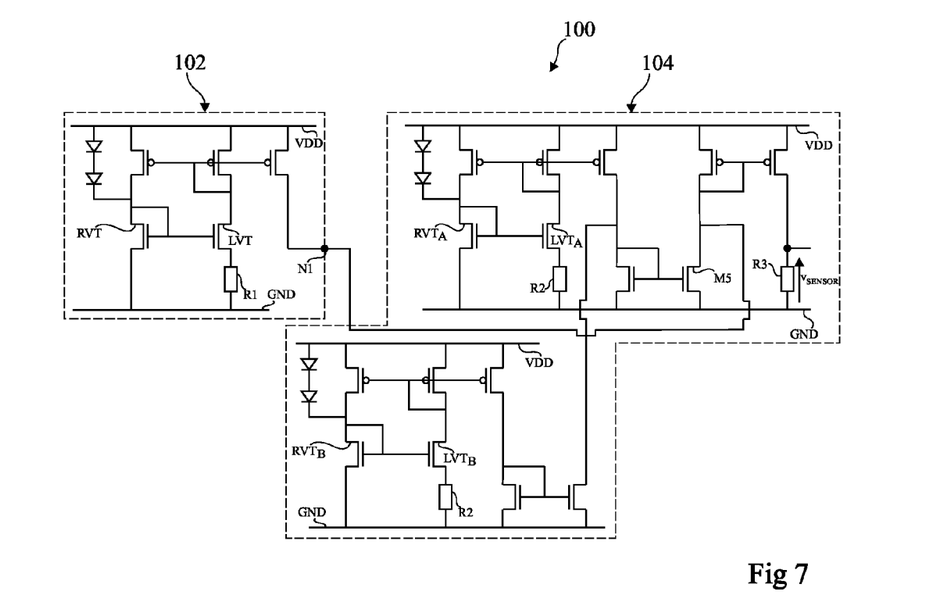
FIG. 7 shows an embodiment of a temperature sensor.

FIG. 7 shows an embodiment of a temperature sensor 100. Circuit 100 comprises an LTD circuit 102 identical to circuit 60 shown in FIG. 3 and a PTAT circuit 104 identical to circuit 70 shown in FIG. 4. Node N1 of LTD circuit 102 is connected to the drain of MOS transistor M5 of circuit 104.

The current flowing through resistor R3 is equal to the difference of the current provided by LTD circuit 102 and of the current provided by PTAT circuit 104. This corresponds to previously-described relation (17) if resistors R1 and R2 verify relation (18). Resistor R3 and factor $K_{Body\text{-}Bias}$ enable to modify the level of maximum voltage $V_{SENSOR\_MAX}$.

Figure 8:
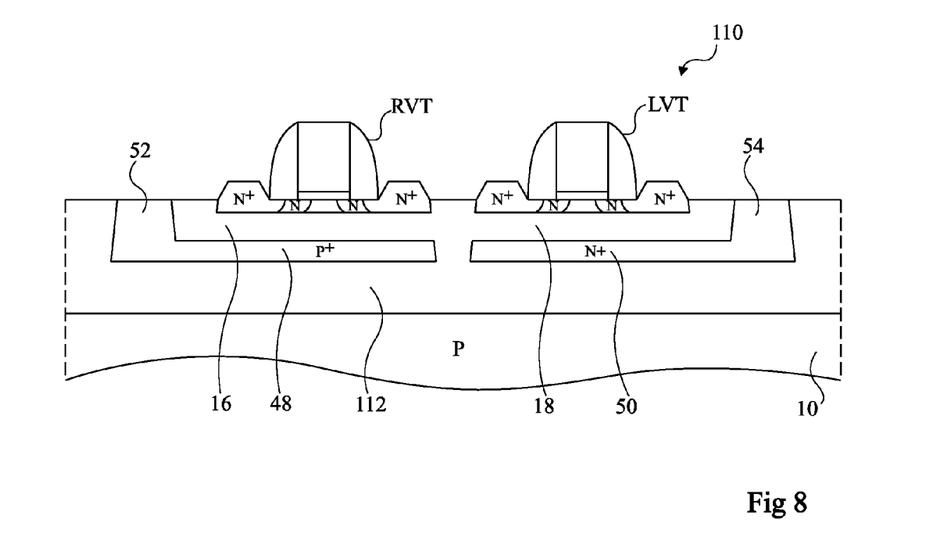
FIG. 8 is a partial simplified cross-section view of another embodiment of an integrated circuit suitable for the forming of an electronic circuit for providing a voltage having accurately-controlled temperature variations.

FIG. 8 shows another embodiment of an integrated circuit 110 especially suitable for the forming of previously-described circuits 60, 70, 80, 90, 100. As compared with integrated circuit 5 shown in FIG. 1, integrated circuit 110 comprises an additional insulating layer 112 which separates regions 48, 50 from the rest of substrate 10. Regions 40, 42, less heavily-doped than regions 48, 50, may be omitted. Region 48 is then directly connected to well 52 and region 50 is directly connected to well 54.

Specific embodiments have been described. Various alterations and modifications will occur to those skilled in the art. In particular, although electronic circuits 60, 70, 80, 90, 100 have been described as comprising N-channel MOS transistors, it should be clear that these circuits may be adapted to use P-channel MOS transistors.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

The invention claimed is:

1. An electronic circuit for providing an output linearly dependent on temperature within a temperature range, the electronic circuit comprising:
   first and second metal-oxide semiconductor (MOS) transistors configured to conduct a same drain current, each MOS transistor having
      a doped semiconductor region,
      an insulating layer, and
      a fully depleted channel being separated from said doped semiconductor region by said insulating layer,
      said insulating layer laterally separating said doped semiconductor region and protruding vertically into said doped semiconductor region,
   said doped semiconductor region of said first MOS transistor having a first conductivity type;
   said doped semiconductor region of said second MOS transistor having a second conductivity type;
   said output being proportional to a difference between gate-source/drain voltages of said first and second MOS transistors.

2. The electronic circuit of claim 1, wherein each MOS transistor comprises doped semiconductor areas forming drain and source regions having the second conductivity type.

3. The electronic circuit of claim 1, wherein said doped semiconductor region of said first MOS transistor and said doped semiconductor region of said second MOS transistor are biased to a same voltage.

4. The electronic circuit of claim 1, wherein respective dopant concentrations of said doped semiconductor region of said first MOS transistor and said doped semiconductor region of said second MOS transistor are between $10^{15}$ atoms/cm$^3$ and $10^{20}$ atoms/cm$^3$.

5. The electronic circuit of claim 1, further comprising a substrate; and wherein the fully depleted channel of each MOS transistor is in a layer of semiconductor material separated from said substrate by the insulating layer.

6. The electronic circuit of claim 1, wherein a thickness of the fully depleted channel of each MOS transistor is less than 10 nm.

7. The electronic circuit of claim 1, wherein a thickness of the insulating layer is between 10 nm and 200 nm.

8. A circuit for providing an output proportional to absolute temperature within a temperature range, the circuit comprising:
   first and second sub-circuits, each sub-circuit comprising
      first and second metal-oxide semiconductor (MOS) transistors configured to conduct a same drain current, each MOS transistor having
         a doped semiconductor region,
         an insulating layer, and
         a fully depleted channel being separated from said doped semiconductor region by said insulating layer,
      said doped semiconductor region of said first MOS transistor having a first conductivity type,
      said doped semiconductor region of said second MOS transistor having a second conductivity type,
      said output being proportional to a difference between gate-source/drain voltages of said first and second MOS transistors;
   wherein dopant concentrations of at least two doped semiconductor regions of a same conductivity type in the first and second sub-circuits are different.

9. The circuit of claim 8, wherein each MOS transistor comprises doped semiconductor areas forming drain and source regions having the second conductivity type.

10. The circuit of claim 8, wherein said doped semiconductor region of said first MOS transistor and said doped semiconductor region of said second MOS transistor are biased to a same voltage.

11. The circuit of claim 8, wherein respective dopant concentrations of said doped semiconductor region of said first MOS transistor and said doped semiconductor region of said second MOS transistor are between $10^{15}$ atoms/cm$^3$ and $10^{20}$ atoms/cm$^3$.

12. The circuit of claim 8, wherein a thickness of the fully depleted channel of each MOS transistor is less than 10 nm.

13. A circuit for providing a reference output independent from temperature within a temperature range, the circuit comprising:
   first and second circuits;
   said first circuit for providing an output linearly dependent on the temperature within the temperature range, the first circuit comprising
      first and second metal-oxide semiconductor (MOS) transistors configured to conduct a same drain current, each MOS transistor having
         a doped semiconductor region,
         an insulating layer, and
         a fully depleted channel being separated from said doped semiconductor region by said insulating layer,
      said doped semiconductor region of said first MOS transistor having a first conductivity type,
      said doped semiconductor region of said second MOS transistor having a second conductivity type,
      said output being proportional to a difference between gate-source/drain voltages of said first and second MOS transistors;
   said second circuit configured to provide an output proportional to the temperature within the temperature range, having two of said first circuits;
   wherein dopant concentrations of at least two doped semiconductor regions of a same conductivity type are different;
   wherein variation rates of the outputs provided by the first and second circuits have opposite signs.

14. The circuit of claim 13, wherein each MOS transistor comprises doped semiconductor areas forming drain and source regions having the second conductivity type.

15. The circuit of claim 13, wherein said doped semiconductor region of said first MOS transistor and said doped semiconductor region of said second MOS transistor are biased to a same voltage.

16. The circuit of claim 13, wherein respective dopant concentrations of said doped semiconductor region of said first MOS transistor and said doped semiconductor region of said second MOS transistor are between $10^{15}$ atoms/cm$^3$ and $10^{20}$ atoms/cm$^3$.

17. The circuit of claim 13, wherein a thickness of the fully depleted channel of each MOS transistor is less than 10 nm.

18. A circuit for providing an output linearly dependent on temperature between two adjustable values within a temperature range, the circuit comprising:
   first and second circuits;
   said first circuit comprising first and second metal-oxide semiconductor (MOS) transistors configured to conduct a same drain current, each MOS transistor having a doped semiconductor region, an insulating layer, and a fully depleted channel being separated from said doped semiconductor region by said insulating layer, said doped semiconductor region of said first MOS transistor having a first conductivity type, said doped semiconductor region of said second MOS transistor having a second conductivity type, said output being proportional to a difference between gate-source/drain voltages of said first and second MOS transistors;

said second circuit configured to provide an output proportional to the temperature within the temperature range, comprising two circuits of said first circuit;

wherein dopant concentrations of at least two doped semiconductor regions of a same conductivity type are different;

wherein variation rates of the outputs provided by the first and second circuits have the same sign.

19. The circuit of claim 18, wherein each MOS transistor comprises doped semiconductor areas forming drain and source regions having the second conductivity type.

20. The circuit of claim 18, wherein said doped semiconductor region of said first MOS transistor and said doped semiconductor region of said second MOS transistor are biased to a same voltage.

21. The circuit of claim 18, wherein respective dopant concentrations of said doped semiconductor region of said first MOS transistor and said doped semiconductor region of said second MOS transistor are between $10^{15}$ atoms/cm$^3$ and $10^{20}$ atoms/cm$^3$.

22. The circuit of claim 18, wherein a thickness of the fully depleted channel of each MOS transistor is less than 10 nm.

* * * * *